United States Patent [19]

Knauer et al.

[11] 4,200,848
[45] Apr. 29, 1980

[54] TRANSVERSAL FILTER

[75] Inventors: Karl Knauer, Starnberg; Hans-Joerg Pfleiderer, Zorneding, both of Fed. Rep. of Germany

[73] Assignee: Siemens Aktiengesellschaft, Berlin & Munich, Fed. Rep. of Germany

[21] Appl. No.: 907,011

[22] Filed: May 18, 1978

[30] Foreign Application Priority Data

Jun. 16, 1977 [DE] Fed. Rep. of Germany ....... 2727339

[51] Int. Cl.$^2$ .................. H03H 7/28; H03H 7/30; G11C 19/14; H03K 5/159
[52] U.S. Cl. .................. 333/165; 307/221 D; 333/166; 357/24; 364/862
[58] Field of Search .................. 333/165, 166; 307/221 R, 221 C, 221 D; 357/24; 328/167; 364/572, 576, 862

[56] References Cited

U.S. PATENT DOCUMENTS

| 4,035,628 | 7/1977 | Lampe et al. | 328/167 X |
| 4,041,298 | 8/1977 | Lampe et al. | 364/862 |

OTHER PUBLICATIONS

Tompsett et al., "Charge Transfer Devices," Academic Press, Inc., New York, 1975, pp. 216-233.
Knauer et al., "Parallel-In/Serial-Out: A New Approach for C.C.D. Transversal Filters," in Electronics Letters, Mar. 3, 1977, vol. 13, No. 5, pp. 126-127.

Primary Examiner—Alfred E. Smith
Assistant Examiner—Marvin Nussbaum
Attorney, Agent, or Firm—Hill, Van Santen, Steadman, Chiara & Simpson

[57] ABSTRACT

A transversal filter has at least one analog shift register which includes a number of parallel inputs and one series output. A further number of individual, predeterminable evaluator circuits are provided, each evaluator circuit having at least one signal input for the input of the signal to be filtered and at least one output, and each evaluator circuit comprises a pair of capacitors arranged on a surface of a substrate. The substrate has at least one substrate terminal and comprises doped semiconductor material which carries a first insulating layer or blocking layer capacitor which contacts an oppositely doped zone located on the surface of the substrate and which is provided with a terminal contact. A second insulating layer or blocking layer capacitor is arranged beside the first capacitor, the second capacitor connectible, via a switching element, to an associated parallel input. At least one evaluator circuit is designed such that its doped zone has a recess into which the first insulating layer or blocking layer capacitor is disposed, the first capacitor likewise having a recess into which the second capacitor is disposed so that the second capacitor is surrounded by the doped zone and by the first capacitor.

7 Claims, 4 Drawing Figures

TRANSVERSAL FILTER

BACKGROUND OF THE INVENTION

1. Field of the Invention

The present invention relates to a transversal filter of the type which has at least one analog shift register.

2. Description of the Prior Art

Transversal filters are known in the art which are constructed with charge-coupled shift devices (CCDs), and employ either the split electrode principle or the CCD possesses parallel outputs at which the signal can be withdrawn. Such devices are described, for example, in the publication "Charge Transfer Devices" by M. F. Tompsett and C. H. Sequin, published by Academic Press, Inc., New York, San Francisco, London, 1975. In these structures the desired filter function is realized as a pulse response, i.e. a short pulse as an input signal produces the desired pulse response as an output signal at the output end of the circuit by dividing the individual electrodes of the CCD in the case of the case of the split electrode principle and by evaluating the parallel outputs in the case of the other principle.

In the split electrode principle, the output signal is formed from the difference between two high voltages which presents considerable circuitry problems. Another problem is that, under the most unfavorable circumstances, small charge parcels are distributed over large areas. In the process employing parallel outputs, floating gate amplifiers are required which, due to their complicated construction, require a multi-layer metalization, for example, and consequently entail problems in production and further problems during operation, for example, as a result of attenuation due to voltage division.

In an application of Karl Knauer et al, Ser. No. 832,232, filed Sept. 12, 1977, and now U.S. Pat. No. 4,163,957, an improved transversal filter is disclosed which has an analog shift register which is provided with a number of parallel inputs and one series output. A further number of individual predeterminable evaluating circuits is provided and each evaluating circuit has at least one signal input for the input of the signal to be filtered and at least one ouput. At its output each evaluating circuit is supplied with a quantity of charge which, in addition to an individual evaluation factor, is equal to the difference quantity of the relevant signal value of the signal to be filtered and a predetermined minimum value which is smaller than or equal to the value of the signal minimum, or apart from the individual factor is equal to the difference quantity of a predeterminable maximum value which is greater than or equal to the value of the signal maximum and the relevant signal value. The output of each evaluating circuit can be connected by way of a switching element to an associated parallel input and the capacity of each storage position of the shift register is at least such that it can always accommodate the maximum quantity of charge supplied by the adjacent storage position in the direction opposite to that of the shift process, and when the storage position is one having a parallel input, the capacity can additionally accommodate the maximum quantities of charge supplied by the associated evaluating circuit or circuits. In a preferred embodiment of that invention, each parallel input is assigned only one of the evaluating circuits.

SUMMARY OF THE INVENTION

The object of the present invention is to provide transversal filters of the type generally mentioned above which exhibit an improved operating behavior.

A first embodiment of the invention which attains the above object is constructed such that at least one evaluator circuit is designed in such a manner that its doped zone possesses a recess into which its first insulating layer capacitor or blocking layer capacitor is disposed, and that the first capacitor likewise possesses a recess in which its second insulating layer capacitor or blocking layer capacitor fits, so that the second capacitor is surrounded by the doped zone and by the first capacitor.

The essential advantages of this first embodiment are, on the one hand, operation at higher pulse train frequencies as possible, and, on the other hand, a higher degree of accuracy is achieved in the realization of the positive and negative, individual evaluation factors. In the relevant evaluator circuit, a quantity of charge corresponding to that of conventional evaluator circuits is stored on a smaller area. Not-linearities in the evaluation factors dependent upon the relevant signal value of the signal to be filtered are considerably reduced.

An advantageous further development of the first embodiment is constructed such that directly beside the second insulating layer capacitor blocking layer capacitor, a third insulating layer capacitor or blocking layer capacitor is arranged on the substrate so that the first-mentioned capacitor is entirely surrounded by insulating or blocking layer capacitors. This further development can advantageously be operating in such a manner that any remaining non-linearities dependent upon the relevant signal value of the signal to be filtered are entirely eliminated, at least in the first approximation.

A second embodiment of a transversal filter of the type generally mentioned above and which attains the aforementioned object is constructed such that at least between a switching element and the associated parallel input of the shift register an additional insulating layer or blocking layer capacitor is arranged which serves as an intermediate store.

A fundamental advantage of this second embodiment resides in the fact that the signal range in the shift register is no longer limited to the difference between the maximum operating voltage of the shift register and the maximum voltage, but is only dependent upon the maximum operating voltage.

A further advantageous embodiment which attains the aforementioned object is designed such as to constitute a combination of the further development of the first embodiment and the second embodiment in such a manner that at least one evaluator circuit is provided with both a thrid and an additional insulating layer or blocking layer capacitor and that the third insulating layer or blocking layer capacitor simultaneously forms the switching element.

In this manner, the advantages of the first embodiment, its further development and the second embodiment can be combined in a single embodiment which may be preferred over the first and second embodiments.

BRIEF DESCRIPTION OF THE DRAWINGS

Other objects, features and advantages of the invention, its organization, construction and operation will be best understood from the following detailed description, taken in conjunction with the accompanying drawings, on which:

In order to improve clarity, the illustrations are schematically representative of the structure and are not according to scale.

DESCRIPTION OF THE PREFERRED EMBODIMENTS

Figure 1:
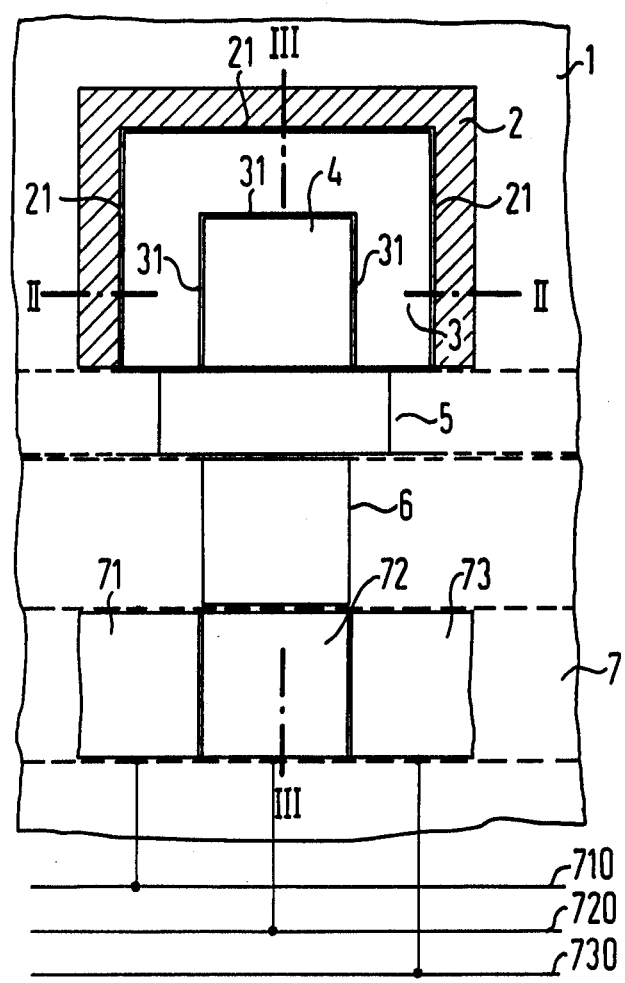
FIG. 1 is a plan view of a design of an evauator circuit constructed in accordance with the principles of the present invention and corresponding to the combination of the further development of the first embodiment and of the second embodiment of the invention and of that portion of the shift register to which the evaluator circuit is connected.

In FIG. 1, on a surface of a substrate 1 consisting of doped semiconductor material, an oppositely doped zone 2 of an evaluator circuit is arranged, the zone 2 being emphasized by hatching. The zone 2 has a recess, the edge of which is referenced 21 and into which fits the first insulating layer or blocking layer capacitor of the evaluator circuit, of which capacitor only the outer electrode 3 is visible. If possible edge fields prevailing during operation are disregarded, the surface form of the outer electrode 3 is identical to that of the overall insulating layer capacitor or blocking layer capacitor. Consequently, the capacitor likewise possesses a recess, the edge of which coincides with the edge, reference 31, of the outer electrode 3, again disregarding possible edge fields. The second insulating layer or blocking layer capacitor of the evaluator circuit, of which only the outer elecrode 4 is visible, fits into this recess 31. The surface form of this electrode is again identical to that of the overall insulating layer or blocking layer capacitor when edge fields are disregarded. The second insulating layer or blocking layer capacitor is therefore surrounded by the first insulating layer or blocking layer capacitor and by the doped zone 2.

This construction of the evaluator circuit serves to reduce the length of time required to transmit a quantity of charge from the doped zone 2 into the second insulating layer capacitor 4, and likewise the length of time necessary for any excess quantity of charge to flow back into the doped zone 2. This facilitates operation at higher pulse train frequencies.

Furthermore, the fact that the second insulating layer or blocking layer capacitor is virtually completely bordered by the first capacitor means that a constant surface potential prevails at the edge of the second capacitor as the potential well beneath the outer electrode 4 is filled by mobile charge carriers to the surface potential beneath the electrode 3. Consequently, no potential drop, and therefore likewise no edge fields prevail outside the edge in question of the electrode 4.

This construction involves two decisive advantages. First of all, the active surface beneath which charges are stored corresponds to the electrode 4, as a result of which a high degree of accuracy is reached both in the case of positive and negative evaluation factors since the active surface is no longer dependent upon the minimum signal voltage, as was previously the case. Secondly, in the case of negative evaluation factors, the active surface was previously modified in dependence upon the signal voltage producing a non-linear component. This non-linearity is eliminated by the provision of an evaluator circuit of the type illustrated in FIG. 1, as edge effects in the electrode 4 are no longer dependent upon the signal voltage.

The evaluator circuit illustrated in FIG. 1 can be connected in the conventional manner via a switching element, usually a gate electrode to a shift register, which in FIG. 1 consists of a charge coupled shift device (CCD) 7 for three-phase operation, the CCD comprising the elctrodes 71-13 and the pulse train represented by the lines 710, 720 and 730.

Advantageously, however, as illustrated in FIG. 1, the connection is effected by way of a third insulating layer or blocking layer capacitor whose outer electrode is referenced 5, and by way of an additional insulating layer or blocking layer capacitor whose outer electrode is referenced 6. The third capacitor serves, on the one hand, to eliminate any remaining edge fields, producing non-linearities, at least in the first approximation, for which purpose it is to extend over, and preferably beyond, the entire width of the second capacitor 4, and on the other hand, its electrode 5 serves in the conventional manner as a gate electrode and, consequently, as a switching element.

The additional capacitor serves as an intermediate store. Beneath its electrode 6 it is possible to intermediately store a quantity of charge which is to be input into the shift register 7 from the second capacitor.

Figure 2:
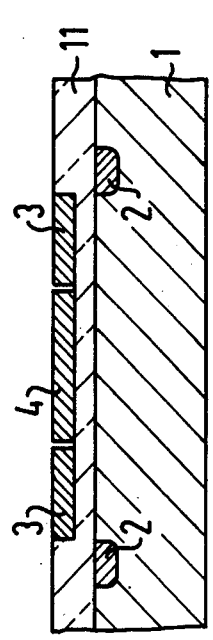
FIG. 2 is a sectional view taken substantially along the line II—II of FIG. 1.
Figure 3:
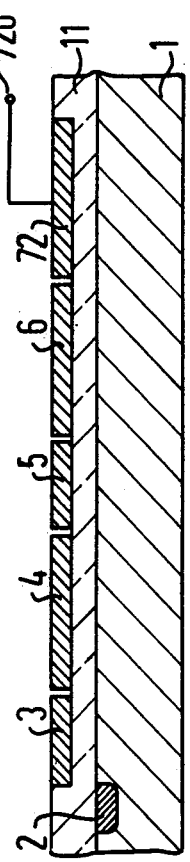
FIG. 3 is a sectional view taken substantially along the line III—III of FIG. 1 and which extends transversely of the section illustrated in FIG. 2.

FIGS. 2 and 3 are cross-sectional representations of the embodiments illustrated in FIG. 1, taken along the sectional lines II—II and III—III, respectively. All of the capacitor electrodes 3—6 and 72 are separated from the substrate by an electrically insulating layer 11. Consequently, these electrodes are insulating layer capacitors. The layer 11 has not been illustrated in FIG. 1 for the purpose of clarity. In fact, it would be superfluous if all capacitors were pure blocking layer capacitors.

Figure 4:
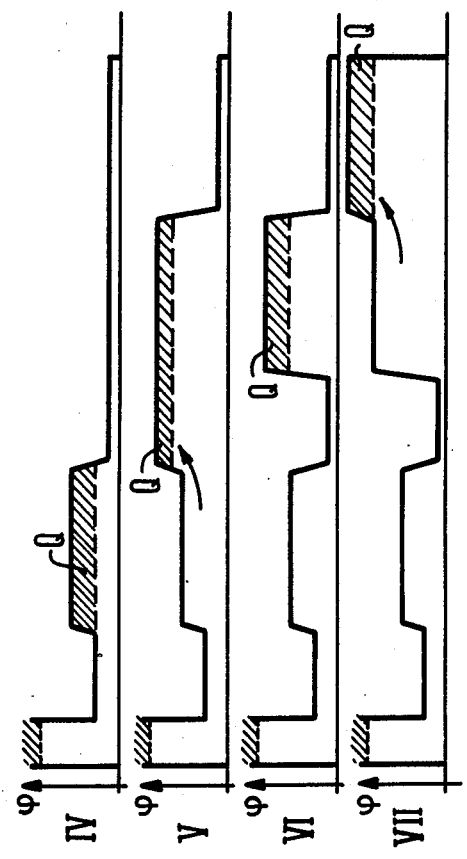
FIG. 4 illustrates in four diagrams IV–VII the local course of the surface potential along the sectional line III—III in various operating states.

The transfer of charge into the shift register will be described with reference to FIG. 4. In FIG. 4, the diagram V illustrates the situation in which a quantity of charge Q has already been brought from the doped zone 2 to a position beneath the electrode 4. In this connection, it should be pointed out that vertical reference should be taken from FIG. 4 to FIG. 3. The quantity of charge Q is represented in FIG. 4 by the shaded areas which have the same areal content. In the diagram V, the quantity of charge Q has already flowed to beneath the two electrodes 5 and 6. This is carried out by producing a corresponding potential well by a suitable voltage connected to these electrodes. Now, as a result of the connection of a corresponding voltage to the electrode 5, the quantity of charge is entirely cut off from the electrode 4 by means of a potential threshold and intermediately stored only beneath the electrode 6. This situation is represented in the diagram VI. The diagram VII illustrates the state in which the quantity of charge Q has already flowed to beneath the electrode 72 of the CCD 7. Following the further transportation of the quantity of charge, the process can be re-initiated. This process additionally provides the advantage that the voltage range in the shift device can be twice that in the aforementioned Knauer application, as a result of which the area required for the shift device can be reduced by one half.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a transversal filter of the type which comprises at least one analog shift register which includes a number of parallel inputs and one series output, and further includes a number of individual, predeterminable evaluator circuits, each evaluator circuit including at least one signal input for the input of the signal to be filtered and at least one output, and wherein each evaluator circuit includes a pair of capacitors arranged on a surface of a substrate of doped semiconductor material which is provided with at least one substrate terminal, and which comprises a first insulating layer capacitor which contacts a zone of the substrate which is located on the surface of the substrate which has a terminal contact, and which is doped oppositely to the substrate, and comprising a second insulating layer capacitor which is arranged closely beside the first capacitor, and wherein the second insulating layer capacitor is connectible via a switching element to an associated parallel input, the improvement wherein:

at least one evaluator circuit includes a doped zone having a first recess with the first insulating layer blocking layer-capacitor disposed in the first recess; and said first capacitor includes a second recess with the second insulating layer capacitor disposed therein so that the latter is surrounded by the doped zone and by the first insulating layer capacitor.

2. The improved transversal filter of claim 1, further defined as comprising:

a third insulating layer capacitor and an additional insulating layer capacitor on said substrate in an evaluator circuit with said third capacitor constituting the switching element.

3. The improved transversal filter of claim 1, further defined as comprising:

a third insulating layer capacitor arranged on the substrate so that the second capacitor is entirely surrounded by insulating layer capacitors.

4. The improved transversal filter of claim 3, further defined as comprising:

a third insulating layer capacitor and an additional insulating layer capacitor on said substrate in an evaluator circuit with said third capacitor constituting the switching element.

5. In a transversal filter of the type which comprises at least one analog shift register which includes a number of parallel inputs and one series output, and further includes a number of individual, predeterminable evaluator circuits, each evaluator circuit including at least one signal input for the input of the signal to be filtered and at least one output, and wherein each evaluator circuit includes a pair of capacitors arranged on a surface of a substrate of doped semiconductor material which is provided with at least one substrate terminal, and which comprises a first insulating layer capacitor which contacts a zone of the substrate which is located on the surface of the substrate which has a terminal contacts, and which is doped oppositely to the substrate, and comprising a second insulating layer capacitor which is arranged closely beside the first capacitor, and wherein the second insulating layer capacitor is connectible via a switching element to an associated parallel input, the improvement wherein:

an additional insulating layer capacitor arranged between at least one switching element and the associated parallel input of the shift register to serve as an intermediate store.

6. The improved transversal filter of claim 5, further defined as comprising a third insulating layer capacitor and an additional insulating layer capacitor on said substrate in an evaluator circuit with said third capacitor constituting the switching element.

7. In a transversal filter of the type which comprises at least one analog shift register which includes a number of parallel inputs and one series output, and further includes a number of individual, predeterminable evaluator circuits, each evaluator circuit including at least one signal input for the input of the signal to be filtered and at least one output, and wherein each evaluator circuit includes a pair of capacitors arranged on a surface of a substrate of doped semiconductor material which is provided with at least one substrate terminal, and which comprises a first insulating layer capacitor which contacts a zone of the substrate which is located on the surface of the substrate which has a terminal contact, and which is doped oppositely to the substrate, and comprising a second insulating layer capacitor which is arranged closely beside the first capacitor, and wherein the second insulating layer capacitor is connectible via a switching element to an associated parallel input, the improvement wherein:

at least one evaluator circuit includes a doped zone having a first recess with the first insulating layer capacitor disposed therein;

said first capacitor includes a second recess with said second capacitor disposed therein so as to be surrounded by the doped zone and the first capacitor; and an additional insulating layer capacitor arranged between at least one switching element and the associated parallel input of of the shift register as an intermediate store.

* * * * *